(12) United States Patent
Wagner et al.

(10) Patent No.: US 12,255,627 B2
(45) Date of Patent: Mar. 18, 2025

(54) HYBRID RESONATORS

(71) Applicant: Intel Corporation, Santa Clara, CA (US)

(72) Inventors: Michael Wagner, Unterhaching (DE); Timo Gossmann, Neubiberg (DE)

(73) Assignee: INTEL CORPORATION, Santa Clara, CA (US)

( * ) Notice: Subject to any disclaimer, the term of this patent is extended or adjusted under 35 U.S.C. 154(b) by 414 days.

(21) Appl. No.: 17/639,920

(22) PCT Filed: Oct. 7, 2019

(86) PCT No.: PCT/US2019/054954
§ 371 (c)(1),
(2) Date: Mar. 3, 2022

(87) PCT Pub. No.: WO2021/071463
PCT Pub. Date: Apr. 15, 2021

(65) Prior Publication Data
US 2022/0337223 A1    Oct. 20, 2022

(51) Int. Cl.
*H03H 9/56* (2006.01)
*H03H 9/15* (2006.01)
*H03H 9/54* (2006.01)

(52) U.S. Cl.
CPC ............ *H03H 9/568* (2013.01); *H03H 9/15* (2013.01); *H03H 9/542* (2013.01)

(58) Field of Classification Search
CPC .......... H03H 9/568; H03H 9/15; H03H 9/542; H03H 9/605; H03H 9/6483; H03H 7/175; H03H 7/1775
See application file for complete search history.

(56) References Cited

U.S. PATENT DOCUMENTS

2017/0179928 A1   6/2017   Raihn et al.
2018/0287584 A1   10/2018  Azarnaminy et al.
(Continued)

FOREIGN PATENT DOCUMENTS

CN    103929148 A  *  7/2014  ........... H03H 7/0161
CN    111211752 A  *  5/2020  ............... H03H 3/02
(Continued)

OTHER PUBLICATIONS

Translation of JP-2011040817-A (Year: 2011).*
(Continued)

*Primary Examiner* — Daniel Pihulic
(74) *Attorney, Agent, or Firm* — VIERING, JENTSCHURA & PARTNER mbB

(57) ABSTRACT

A hybrid resonator includes an acoustic wave resonator (AWR) having a piezoelectric material; a first electrical contact, electrically conductively connected to the piezoelectric material; and a second electrical contact, electrically conductively connected to the piezoelectric material. The hybrid resonator further includes a first resonant circuit, electrically conductively connected in series or parallel to the acoustic wave resonator via at least one of the first electrical contact and the second electrical contact. The resonant circuit includes a first inductor, and a first capacitor; wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series.

20 Claims, 12 Drawing Sheets

(56) References Cited

U.S. PATENT DOCUMENTS

| | | | |
|---|---|---|---|
| 2019/0267969 A1 | 8/2019 | Tsukamoto et al. | |
| 2021/0384890 A1* | 12/2021 | Schmidhammer | ....... H03H 7/38 |
| 2022/0337223 A1* | 10/2022 | Wagner | .................. H03H 9/568 |

FOREIGN PATENT DOCUMENTS

| | | | | |
|---|---|---|---|---|
| CN | 111211752 B | * | 4/2021 | ............... H03H 3/02 |
| CN | 118017971 A | * | 5/2024 | |
| EP | 2913923 A1 | | 9/2015 | |
| EP | 4042567 A1 | * | 8/2022 | ............... H03H 9/15 |
| JP | 2011040817 A | * | 2/2011 | ............... H03H 9/568 |
| WO | WO-2021071463 A1 | * | 4/2021 | ............... H03H 9/15 |
| WO | WO-2023276871 A1 | * | 1/2023 | ............... H03H 9/145 |

OTHER PUBLICATIONS

Alassi, A. et al, "Quartz Crystal Microbalance Electronic Interfacing Systems: a Review", Sensors, Dec. 4, 2017, pp. 1-41, vol. 17, Issue 12, MDPI.

Benech, P. et al, "Piezoelectric Materials in RF Applications", Piezoelectric Materials, Chapter 9, Aug. 24, 2016, pp. 201-227, InTech.

International Search Report issued for the corresponding international patent application No. PCT/US2019/054954, dated Jul. 6, 2020, 2 pages (for informational purposes only).

Gong, S. et al, "Design and Analysis of Lithium-Niobate-Based High Electromechanical Coupling RF-MEMS Resonators for Wideband Filtering", IEEE Transactions on Microwave Theory and Techniques, Jan. 2013, pp. 403-414, vol. 61, Issue 1, IEEE.

Psychogiou, D. et al, "Hybrid Acoustic-Wave-Lumped-Element Resonators (AWLRs) for High-Q Bandpass Filters With Quasi-Elliptic Frequency Response", IEEE Transactions on Microwave Theory and Techniques, Jul. 2015, pp. 2233-2244, vol. 63, Issue 7, IEEE.

Zobel, O. J., "Theory and Design of Uniform and Composite Electric Wave-filters", The Bell System Technical Journal, Jan. 1923, pp. 1-46, vol. 2, Issue 1, Nokia Bell Labs.

Wagner, M. et al., "Theoretical Derivation of Bandwidth Limits of a Symmetric Acoustic-Wave-Lumped-Element Resonator (AWLR) Module", ANALOG 2018, Sep. 13-14, 2018, pp. 123-126, VDE Verlag GmbH, Munich/Neubiberg, Germany.

Supplementary European Search Report for corresponding EP Application No. 19 94 8234, dated Jun. 5, 2023, 10 pages (for informational purposes only).

Wagner, Michael et al., "Design of Wide-Band Asymmetric Hybrid Ladder Filters", 2019 IEEE International Ultrasonics Symposium (IUS), IEEE, 2019, pp. 2572-2575.

Wagner, Michael et al., "Simulations of New Design Concept for Hybrid Ladder Filters", 2019 IEEE 20th Wireless and Microwave Technology Conference (WAMICON), IEEE, 2019, 5 pages.

Weigel, R. et al., "Microwave Acoustic Materials, Devices, and Applications", IEEE Transactions on Microwave Theory and Techniques, Mar. 2002, pp. 738-749, vol. 50, Issue 3, IEEE.

Drafts, B., "Acoustic Wave Technology Sensors", IEEE Transactions on Microwave Theory and Techniques, Apr. 2001, pp. 795-802, vol. 49, Issue 4, IEEE.

Larson III, J. D. et al., "Modified Butterworth-Van Dyke Circuit for FBAR Resonators and Automated Measurement System", 2000 IEEE Ultrasonics Symposium, Oct. 22-25, 2000, pp. 863-868, IEEE, San Juan, United States.

Lu, X. et al., "Wideband Bandpass Filters With SAW-Filter-Like Selectivity Using Chip SAW Resonators", IEEE Transactions on Microwave Theory and Techniques, Jan. 2014, pp. 28-36, vol. 62, Issue 1, IEEE.

Aigner, R. et al., "Bulk-Acoustic-Wave Filters: Performance Optimization and vol. Manufacturing", IEEE MTT-S International Microwave Symposium Digest, Jun. 8-13, 2003, pp. 2001-2004, IEEE, Philadelphia, United States.

Psychogiou, D. et al., "Coupling-Matrix-Based Design of High-Q Bandpass Filters Using Acoustic-Wave Lumped-Element Resonator (AWLR) Modules", IEEE Transactions on Microwave Theory and Techniques, Dec. 2015, pp. 4319-4328, vol. 63, Issue 12, IEEE.

* cited by examiner

Sharp roll-off on upper side:

Single stage:

Sharp roll-off on lower side:

Single stage:

Simulation results for N stages:

HYBRID RESONATORS

CROSS-REFERENCE TO RELATED APPLICATIONS

This is a national phase application of PCT/US2019/054954, filed on Oct. 7, 2019, the contents of which are incorporated herein by reference in its entirety.

TECHNICAL FIELD

Various aspects relate generally to the use of inductive-capacitive-resonating circuits (LC-resonators) to modify a useable frequency-band for an acoustic-wave-resonator.

BACKGROUND

Most integrated radio frequency (RF) filters operate either by utilizing a combination of integrated inductors (L) and capacitors (C), or they rely on one or more Acoustic-Wave Resonators (AWR). AWRs utilize piezoelectric materials to transfer acoustic waves into electrical energy and vice versa. AWRs can be used to create compact, high quality filters with low Insertion Loss (IL). Most Long Term Evolution (LTE) or 4G filters use a plurality of AWRs, which are combined in ladder-type structures.

Changing standards for wireless communication present certain challenges due to AWRs' reliance on piezoelectric materials. For example, the migration to Fifth Generation Cellular Network Technology (5G), and the related difference in bandwidth between LTE and 5G, presents a significant challenge in the use of AWRs. Of particular relevance is that fact that the achievable filter bandwidth of an AWR-based filter is dictated and limited by properties of the particular piezoelectric material of which it is made. With the advent of 5G, filters will be required to operate in different frequency bands and accommodate much wider bandwidths. Materials currently used in AWRs are generally poorly suited for these wide bandwidths.

Many attempts have been made to identify alternative piezoelectric materials, which could be suitable to manufacture AWR-based filters that operate naturally in the 5G spectrum. These searches have proved difficult and costly. Other attempts to modify AWRs have included adding inductors to the AWR, which can lead to a resonance spreading effect. These efforts suffer from the fact that the added inductor introduces an additional series or anti-resonance. This additional resonance is usually undesirable and generally considered parasitic. For filter designs, the parasitic resonance is a limiting factor for the realizable bandwidth. Other attempts to solve this problem have used filters with coupled lines, but these filters cannot generally be integrated into chips due to high area requirements for frequencies in the targeted range below 6 GHz. These filters suffer from low stopband suppression, high area (generally high number of inductances), and serious stopband degradation by inductive coupling, thereby limiting integration capability.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which.

DETAILED DESCRIPTION

Figure 1:
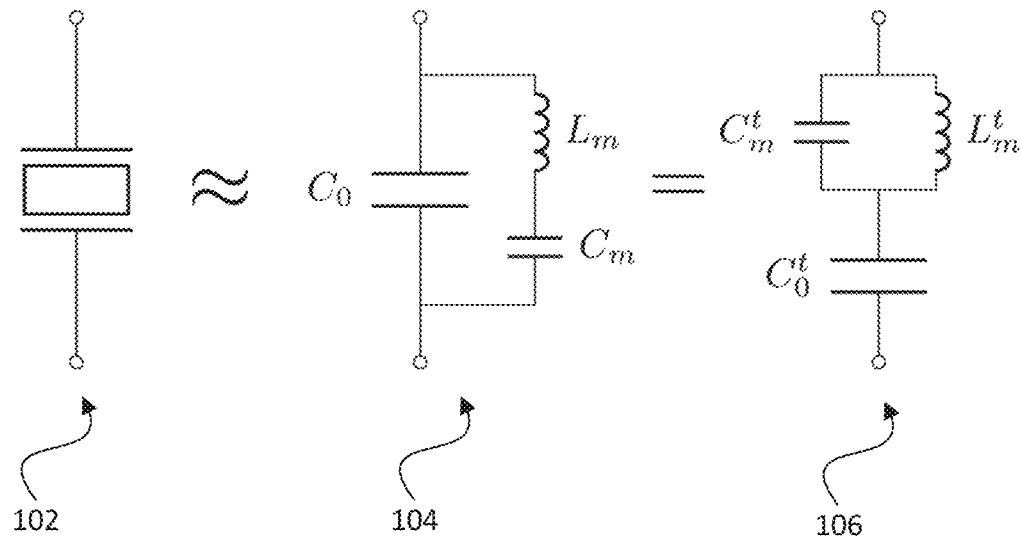
FIG. 1 depicts an exemplary lossless resonator without spurious modes and two equivalent electrical circuit representations.

The following detailed description refers to the accompanying drawings that show, by way of illustration, specific details and aspects in which the disclosure may be practiced. One or more aspects are described in sufficient detail to enable those skilled in the art to practice the disclosure. Other aspects may be utilized and structural, logical, and/or electrical changes may be made without departing from the scope of the disclosure. The various aspects of the disclosure are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The term "exemplary" may be used herein to mean "serving as an example, instance, or illustration". Any aspect or design described herein as "exemplary" is not necessarily to be construed as preferred or advantageous over other aspects or designs.

The terms "at least one" and "one or more" may be understood to include a numerical quantity greater than or equal to one (e.g., one, two, three, four, [ . . . ], etc.). The term "a plurality" may be understood to include a numerical quantity greater than or equal to two (e.g., two, three, four, five, [ . . . ], etc.).

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The words "plural" and "multiple" in the description and in the claims expressly refer to a quantity greater than one. Accordingly, any phrases explicitly invoking the aforementioned words (e.g., "a plurality of (objects)", "multiple (objects)") referring to a quantity of objects expressly refers more than one of the said objects. The terms "group (of)", "set (of)", "collection (of)", "series (of)", "sequence (of)", "grouping (of)", etc., and the like in the description and in the claims, if any, refer to a quantity equal to or greater than one, i.e. one or more.

For the purposes of this disclosure, the combination of an acoustic wave resonator and one or more LC-resonators, when connected using parallel and/or series connections as described herein, may be understood to be a filter stage.

An AWR is a microelectromechanical system (MEMS) that uses a piezoelectric material layer for a transformation between electrical waves and mechanical (acoustic) waves, and electricity is generated as a result of mechanical stress or pressure and/or heat. Different types of AWRs have evolved to accommodate various acoustic wave modes. For example, surface acoustic wave (SAW) resonators make use of acoustic waves that travel along the surface of their piezoelectric material, whereas bulk acoustic wave (BAW) resonators make use of acoustic waves that travel in the mass of the resonator.

From circuit design perspective, AWRs can be described by the modified Butterworth-van-Dyke (BVD) model. The BVD is a circuit model that may be used to simplify the transcendental functions that characterize resonators that are used as filter elements. The BVD model may provide an understanding of the single resonance, as well as other regions of the resonator's transfer functions, which may be modeled as a capacitance. The R-L-C branch may determine the series resonance, in which the impedance may drop sharply to a minimum value at a frequency at which the series inductance and capacitance may cancel each other out. At another higher frequency, the loop reactances may reach zero and cause a parallel resonance, where most current will travel around the loop rather than past it.

The transfer function representing a BVD impedance may be represented as:

$$Z_{BVD} = \frac{1}{sC_0} \frac{s^3 LC + sRC + 1}{s^2 LC + sRC + 1 + \frac{C}{C_0}} \tag{1}$$

This may also be expressed directly in terms of major resonator figures, series resonance $w_s$, parallel resonance $w_p$ and Q as follows:

$$w_s \equiv \sqrt{\frac{1}{LC}} \tag{2}$$

$$w_p \equiv w_s \sqrt{1 + \frac{C}{C_0}} \tag{3}$$

$$Q \equiv \frac{1}{w_s RC} = \frac{w_s L}{R} \tag{4}$$

$$Z_{BVD} = \frac{1}{sC_0} \frac{s^2 + s\frac{w_s}{Q} + w_s^2}{s^2 + s\frac{w_s}{Q} + w_p^2} = \frac{1}{sC_0} \frac{s^2 + s\beta + w_s^2}{s^2 + s\beta + w_p^2} \tag{5}$$

The model may be used to accurately predict the function of any type of AWR. The modal may also be used to describe electric behavior at the ports of the resonator.

FIG. 1 depicts an exemplary lossless resonator 102 (only reactances) without spurious modes. This may be approximately understood to function as a transformed circuit 104 including an LC Resonator with an inductor and capacitor connected in series, wherein the LC Resonator is connected in parallel to a static capacitor $C_o$. A circuit demonstrating similar properties 106 is shown with an LC Resonator having a capacitor and inductor connected in parallel, wherein the LC Resonator is connected to a static capacitor $C_o$ in series.

Figure 2:
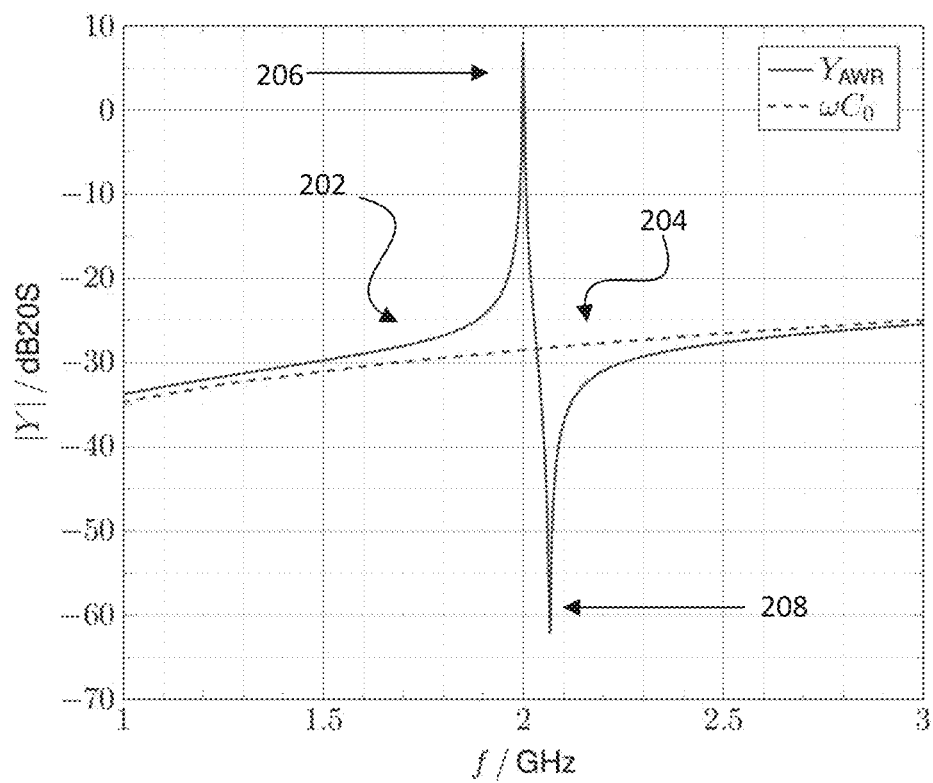
FIG. 2 depicts an admittance plot of an exemplary AWR and static capacitance.

FIG. 2 depicts an admittance plot of an exemplary AWR and static capacitance. The admittance of the AWR is depicted as 202, and the static capacitance is depicted as 204. As can be seen, the admittance rises quite significantly, in this example, as the frequency approaches 2 GHz and then drops quite significantly thereafter. The series resonance is shown as 206, and the parallel resonance is shown as 208.

For the greatest part of the frequency range, the resonator's behavior is dominated by its static capacitance $C_0$. The reactive elements of the motional branch ($L_m$, $C_m$) account for a series resonance, and the parallel combination with the static capacitance leads to a parallel resonance or anti-resonance at a higher frequency than the series resonance. The distance between the series and parallel resonance frequencies is related to material properties. A material property of particular importance is the electromechanical coupling coefficient (EMCC). This distance is also important when using AWRs for filter applications, since the overall achievable bandwidth will always be related to the EMCC.

The effective electro-mechanical coupling coefficient (EMCC), $k_{eff}^2$, depends on the resonant frequencies. This relation is given by:

$$k_{eff}^2 = \frac{\pi^2}{4} \frac{f_r}{f_{ar}} \frac{f_{ar} - f_r}{f_{ar}} \approx \frac{\pi^2}{4} \frac{f_{ar} - f_r}{f_{ar}} \tag{6}$$

Wherein $f_r$ is the resonance frequency and $f_{ar}$ is the anti-resonance frequency.

The EMCC may depend on both properties of the particular material used for the resonator and the resonator's orientation. With Aluminum Nitride (AlN), which is a known piezoelectric material for making AWRs, $k_{eff}^2$ values of 7% are reasonable. In contrast, for Lithium Niobate (LiNbO$_3$), $k_{eff}^2$ values of 45% or higher may be feasible. LiNbO$_3$, however, is primarily used for SAW resonators in the lower frequency ranges. For integrated designs with BAW resonators, AlN is more commonly used due to its simpler integration into common processes.

The resonance and anti-resonance frequency are related to the elements of the equivalent circuit model by:

$$\omega_r = 2\pi f_r = \frac{1}{\sqrt{L_m C_m}} \quad (7)$$

$$\omega_{ar} = 2\pi f_{ar} = \frac{1}{\sqrt{L_m^t C_m^t}} = \omega_r \cdot \sqrt{1 + \frac{1}{r}} \quad (8)$$

$$r := \frac{C_0}{C_m} \quad (9)$$

A BVD model can be transformed to another equivalent circuit as shown in FIG. 1, in which 104 and 106 are represented as BVD equivalents to 102. In this form, the anti-resonance is defined by the parallel LC resonator ($L_m^t$, $C_m^t$). Due to the fixed dimensions of any acoustic-wave resonator, their equivalent circuit values remain constant and in a certain relationship. The element values may depend on the resonator type, targeted operation frequency, physical size and/or employed materials.

The capacitance ratio r is an important figure, that depends on material properties and is related to $k_{eff}^2$ by:

$$k_{eff}^2 = \frac{\pi^2}{8} \frac{1}{r} \left(1 - \frac{1}{r}\right) \quad (10)$$

Figure 3:
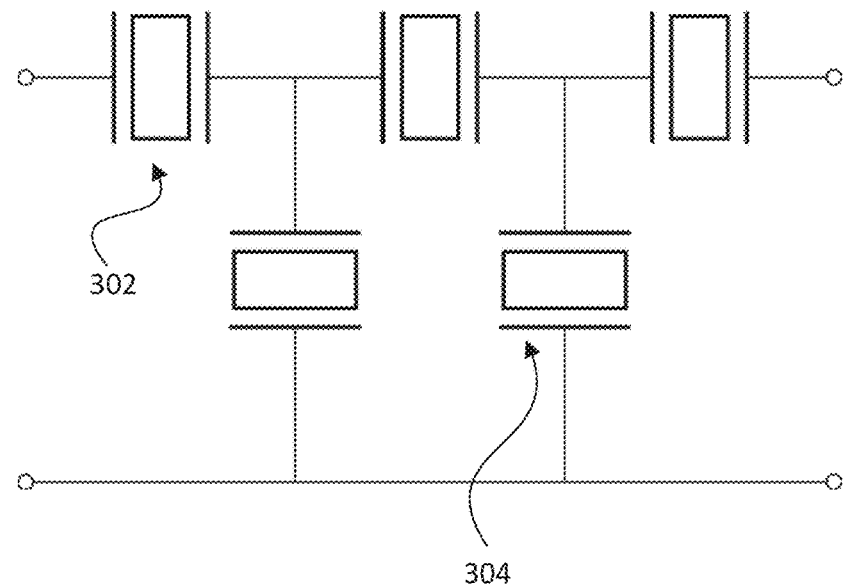
FIG. 3 depicts an application of AWRs for filter design in a ladder-type topology.

FIG. 3 depicts an application of AWRs for filter design in a ladder-type topology. Specifically, this figure shows a ladder-type filter topology including 5 AWRs. The resonators are connected as series resonators 302 and shunt resonators 304.

Figure 4:
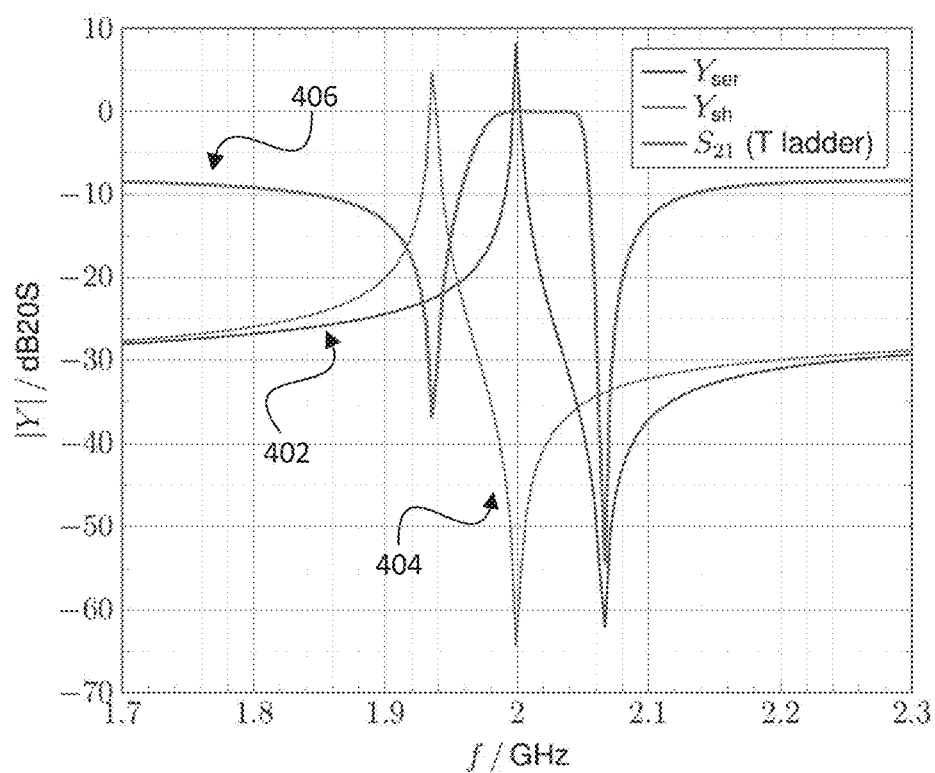
FIG. 4 depicts an admittance plot of series and shunt resonators and according filter responses in a 5-AWR-ladder-structure.

Series and shunt resonators must have different resonance frequencies such that the anti-resonance of the shunt elements matches the series resonance of the series elements. This can be seen in FIG. 4, which depicts an admittance plot of series and shunt resonators and according filter responses in a 5-AWR-ladder-structure. In this case, the admittance of the series AWRs is shown as 402. The admittance of the shunt AWRs is depicted as 404. The filter transmission of the combined ladder is represented as 406. As shown in FIG. 4, series and shunt resonators must have different resonance frequencies in situations in which the anti-resonance of the shunt elements matches the series resonance of the series elements. The fractional bandwidth of such a ladder-type filter is:

$$FBW \approx 0.4 k_{eff}^2 \quad (11)$$

This equation explains the bandwidth limitation due to material properties.

Hybrid resonators can be manufactured with special combinations of AWRs and LC Resonators. The resonators that are designed according to this disclosure may theoretically have widespread resonances that can be configured to meet essentially any resonance demand. These hybrid resonators utilize LC series or parallel resonators added to AWRs in one or more predetermined configurations. In so doing, a spreading effect can be realized without introducing parasitic resonances. Otherwise stated, by adding an inductor and a capacitor in a particular configuration to an AWR, the parasitic resonances that are associated with previously solutions (i.e., the AWR+inductor only) can be largely eliminated.

These hybrid resonators avoid a parasitic series or anti-resonance in their design and may therefore be applicable everywhere in which wide-band filter techniques are required. They may be applied in integrated circuits for future technologies, in which superior filter performance is required or desirable.

According to an aspect of the disclosure, AWRs may be combined with LC-resonators the change the natural resonance of the AWR's piezoelectric material. LC resonators may also be known as "LC-circuits" or "tank circuits" and they include at least one inductor and at least one capacitor. LC Resonators operate by oscillating stored energy at a resonant frequency, as is determined by attributes of the LC Resonator's at least one inductor and at least one capacitor.

The LC elements can be used to manipulate the resonators' overall behavior. Accordingly, the material dependency of the achievable filter bandwidth with these resonators can be eliminated. Eventually, with this approach, traditional filter architectures, design methodologies and materials may be used in new combinations with other elements to achieve wide-band filtering functionality.

For wider bandwidth in AWR filter design, $k_{eff}^2$ value needs to be effectively increased, which means shifting the respective resonance frequencies of the AWR farther apart from each other. This can be achieved by utilizing spreading techniques, such as by adding an inductor in series or parallel to the AWR.

Figure 5:
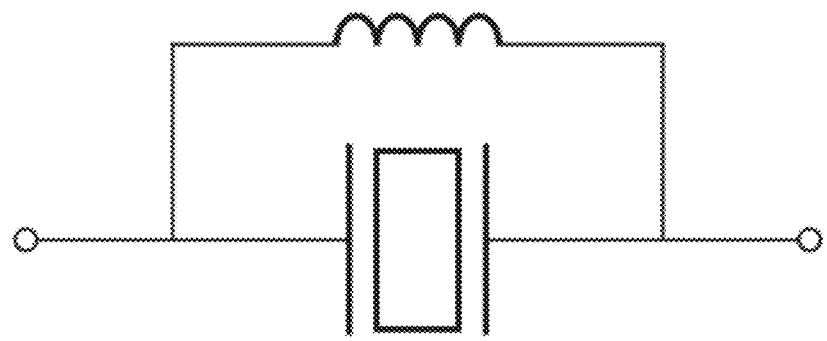
FIG. 5 depicts a technique for increasing the $k_{eff}^2$-value by adding an inductor in parallel to the AWR.
Figure 6:
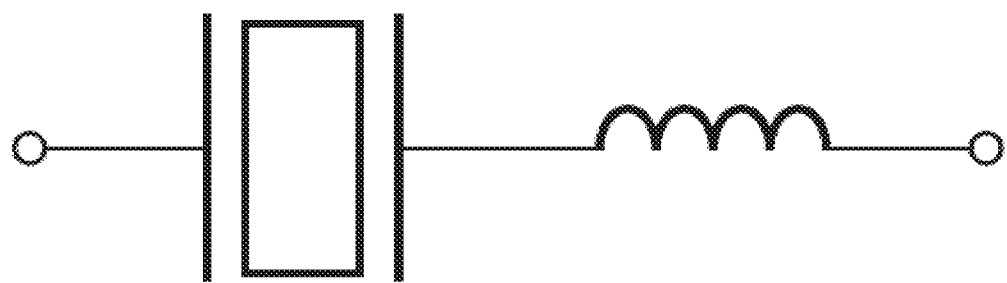
FIG. 6 depicts a technique for increasing the $k_{eff}^2$-value by adding an inductor in series to the AWR.

FIG. 5 depicts a technique for increasing the $k_{eff}^2$ value by adding an inductor in parallel to the AWR. Similarly, FIG. 6 depicts a technique for increasing the $k_{eff}^2$ value by adding an inductor in series to the AWR. Although the term AWLR may generally be understood as describing an AWR with a parallel inductor, the techniques depicted in FIG. 5 and FIG. 6 will, for the sake of convenience, be described herein as "AWLR", thus indicating the addition of an inductor in the AWR, whether through a parallel or a serial connection.

Figure 7:
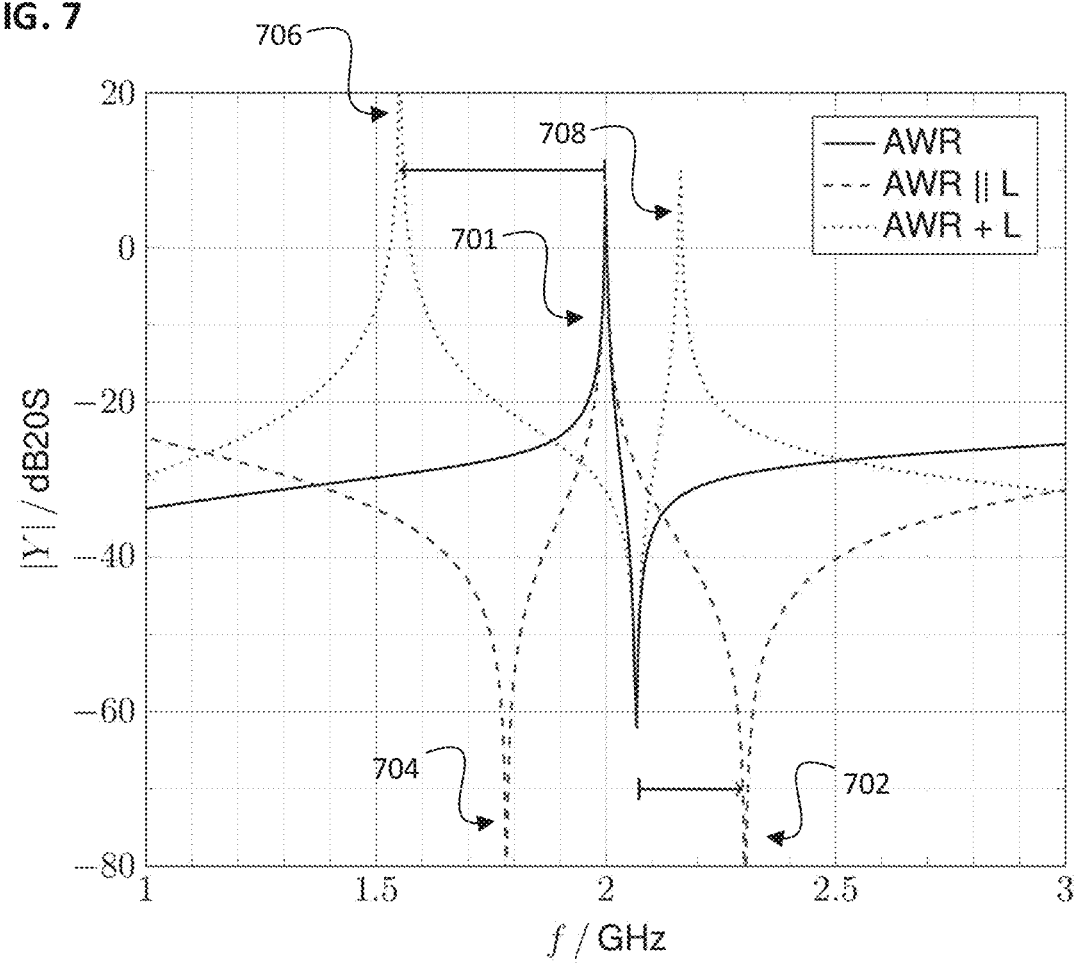
FIG. 7 depicts an admittance curve for the shifted parallel resonance and parasitic resonance in an AWLR configuration and an admittance curve for the shifted series resonance and added parasitic resonance for an AWR with series inductor, compared to the admittance curve of a single AWR.

FIG. 7 depicts an admittance curve for the shifted parallel resonance in such an AWLR configuration. In this figure, the admittance curve for the AWR is shown as 701. By adding a parallel inductor, the admittance curve changes to that depicted in 702 with second, parasitic anti-resonance in 704 below the series resonance frequency. In contrast, the admittance curve for the shifted series resonance 706 exhibits a second, parasitic series resonance higher than the anti-resonance 708. This figure illustrates the drawback of modifying a resonance of an AWR with an inductor only. When using these modified resonators in filter designs, the parasitic resonances account for low band stopband suppression, which limits their usage.

These disadvantages can be largely overcome by modifying an AWR with one or more inductors and one or more capacitors in certain configurations. These modified AWRs, as described herein, create novel, hybrid-resonator configurations that improve upon the AWLR configuration and can be implemented in a complementary fashion relative to one another.

Figure 8:
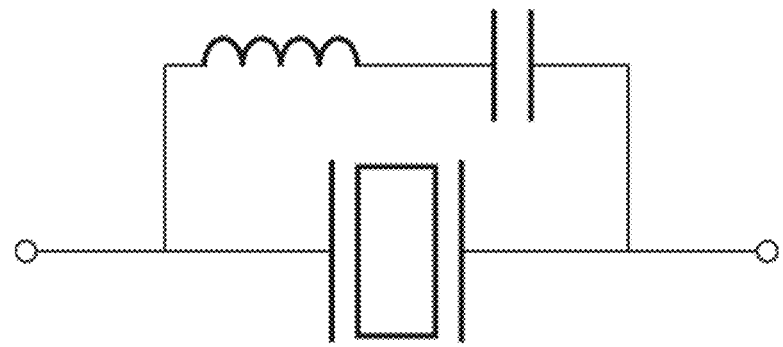
FIG. 8 depicts an inductor and a capacitor being added in parallel to an AWR.

According to one aspect of the disclosure, a series LC resonator may be used in parallel to an AWR that includes the same series resonance. In greater detail, the principles of an AWLR can be extended by using one or more additional capacitors in series to the inductor. In this manner, an LC series resonator may be formed in parallel to the AWR. If the LC resonator and AWR include the same series resonance, a shift of the overall anti-resonance to higher frequencies is possible without introducing a parasitic resonance. This is depicted in FIG. 8, which depicts an inductor and a capacitor (in series with respect to one another) being added in parallel to an AWR. Depending on the values of the LC resonator (e.g., the capacitance C of the capacitor and the inductance L of the inductor), the anti-resonance of the overall structure can be shifted to arbitrarily high frequencies. This means that the resulting $k_{eff}^2$ value of the hybrid resonator can be increased essentially without limitation, which enables applications for wide-band filter designs.

Figure 9:
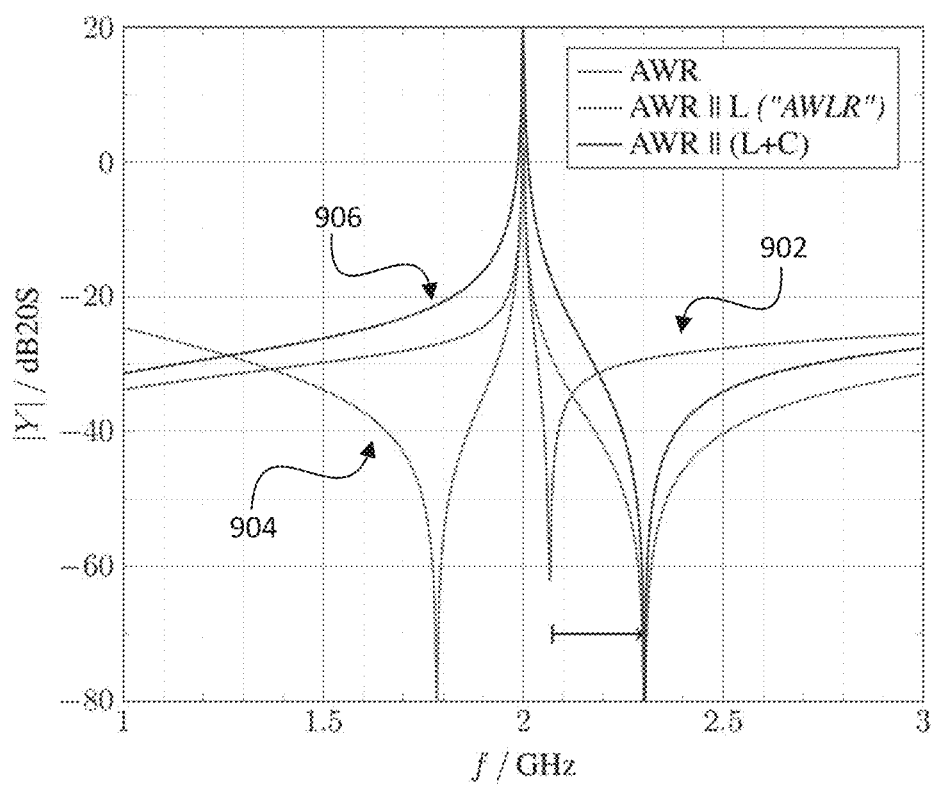
FIG. 9 depicts an admittance plot for various AWR modifications.

FIG. 9 depicts an admittance curve for various AWR modifications, including the hybrid AWR depicted in FIG. 8. A conventional AWR admittance plot is shown by 902. An admittance plot for an AWR as modified by a single inductor is shown by 904. An admittance plot for an AWR as modified by an inductor and capacitor arranged as described herein is shown by 906. As depicted herein, and as a complement to the hybrid structure described supra, a shift of the overall anti-resonance to higher frequencies is possible without introducing a parasitic resonance.

One technique for achieving this is to connect an additional capacitor in parallel to a series inductor, wherein this LC resonator exhibits the same anti-resonance frequency as the AWR. This is depicted in FIG. 10, which shows an AWR connected in series to an LC resonator including an inductor and a capacitor connected in parallel.

Figure 10:
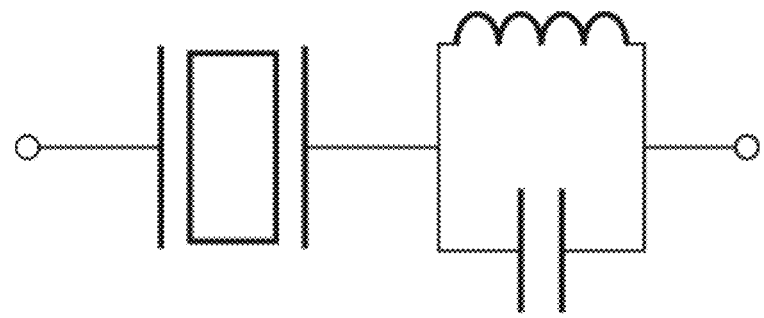
FIG. 10 depicts an AWR connected in series to an LC resonator including an inductor and a capacitor connected in parallel.
Figure 11:
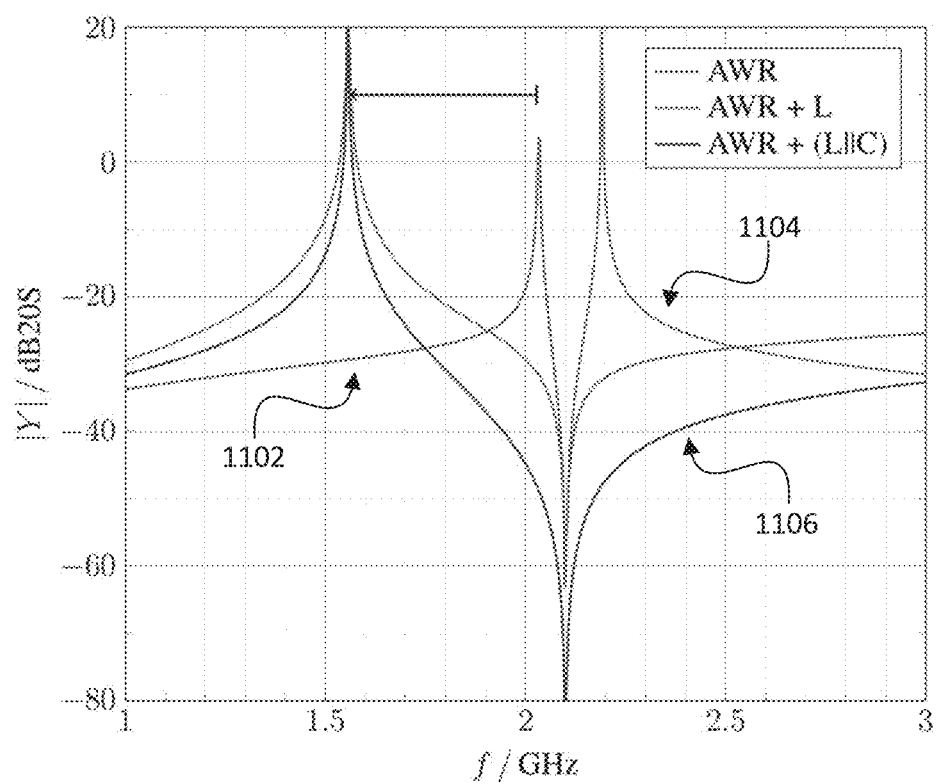
FIG. 11 depicts an admittance plot for various AWR modifications.

FIG. 11 depicts an admittance plot for the AWR configuration depicted in FIG. 10. The admittance curve for a single conventional AWR is depicted as 1102. The admittance curve for a conventional AWR with a single inductor is depicted as 1104. The admittance curve for an AWR with an inductor and capacitor connected in the manner described herein (without the parasitic series resonance) is depicted as 1106. Depending on the values of the LC resonator, the series resonance of the overall structure can be shifted to arbitrarily low frequencies. This also means that the resulting $k_{eff}^2$ value of the hybrid resonator can be increased to nearly any desired value or values, which enables application for wide-band filter designs.

Figure 12:
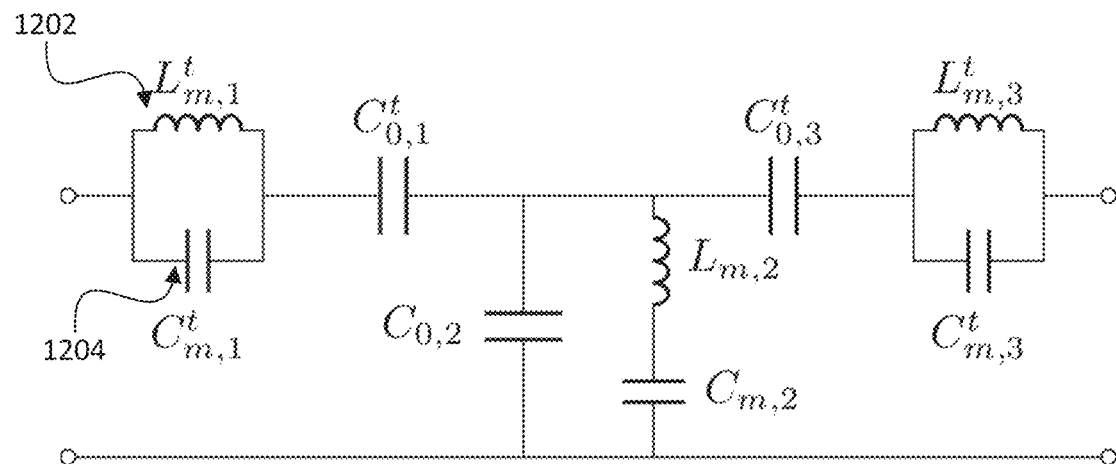
FIG. 12 depicts an exemplary filter with fictive high-$k_{eff}^2$ resonators, according to a first aspect of the disclosure.

FIG. 12 depicts an exemplary filter with fictive high-$k_{eff}^2$ resonators (or their equivalent circuit, respectively), according to a first aspect of the disclosure. In this filter configuration, the inductor 1202 and capacitor 1204 are connected in parallel, and the resulting LC Resonator (1202 and 1204 together) from the parallel-connected inductor and capacitor describes the elements of the equivalent circuit representation according to FIG. 1

Figure 13:
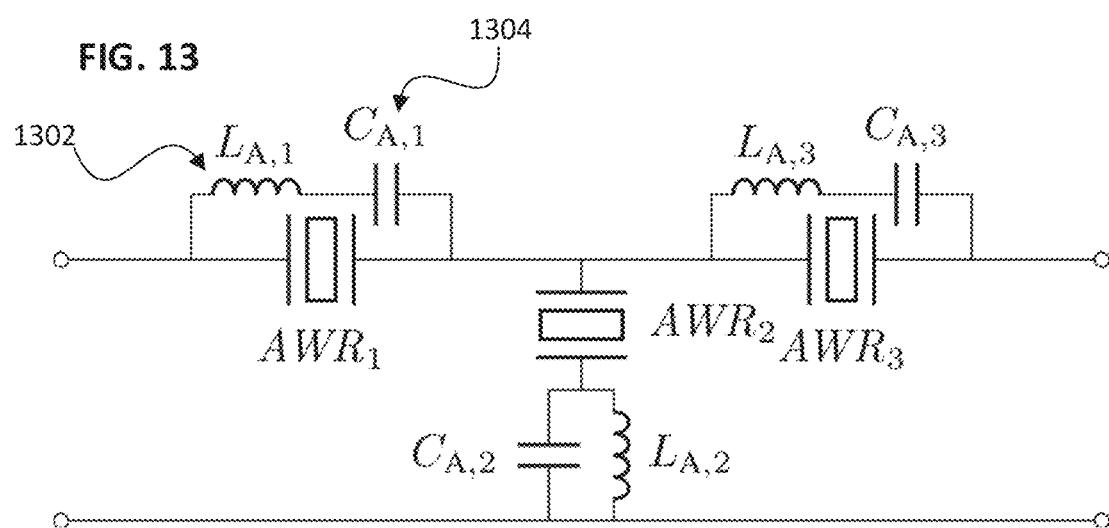
FIG. 13 depicts an exemplary filter with fictive high-$k_{eff}^2$ resonators (made of low-$k_{eff}^2$ resonators and LC resonators), according to a first aspect of the disclosure.

FIG. 13 depicts an exemplary filter with fictive high-$k_{eff}^2$ resonators (or their equivalent circuit, respectively), according to a first aspect of the disclosure. In this filter configuration, the inductor 1302 and capacitor 1304 are connected in series, and the resulting LC Resonator (1302 and 1304 together) from the series-connected inductor and capacitor is connected to the AWR in parallel. The resulting hybrid filter configuration may be characterized by low-$k_{eff}^2$+LC resonators.

The filter may have three transmission zeros at finite frequencies, one in the lower stopband and two in the upper stopband. It may include a fractional bandwidth (FBW) of approximately 10% and may be presented with normalized element values. According to one aspect of the disclosure, the center frequency of the passband may be set to 1. The transmission zeros of the frequency response may be set to 0.9, 1.1 and 1.2. These values may define the resonance and anti-resonance frequencies of the resonators.

The hybrid filter(s) described herein can be realized in a variety of configurations. For example, every high-$k_{eff}^2$ resonator can be transformed to a low-$k_{eff}^2$ resonator plus additional LC Resonator in a least two ways as depicted in FIGS. 8 and 10. Moreover, the circuit shown in FIG. 13 may be realized in at least 8 configurations.

Figure 14:
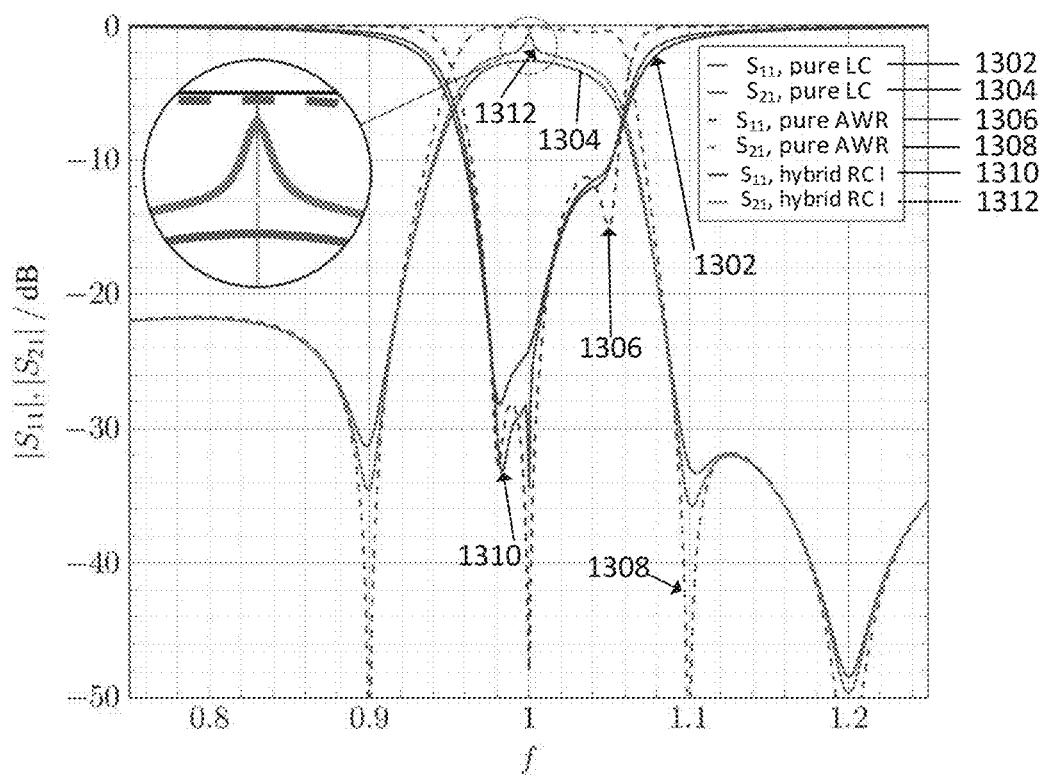
FIG. 14 depicts the filter curve for various resonator configurations.

FIG. 14 depicts the filter curve for the resonator configurations given in FIGS. 12 and 13. In this depiction, a value of $Q_{LC}$=50 is assumed for each LC resonator. The solid dark lines (1302 and 1304) show how the frequency response would appear if the equivalent circuit were realized only with lumped LC elements. The dashed lines (1306 and 1308) show the frequency response if the equivalent circuit were realized by AWRs with a Q of 1000. The required $k_{eff}^2$ value for these (fictive) resonators is 20 to 34% and therefore not realizable with standard materials for IC integration. Comparing a pure LC realization and the hybrid filter realization (high-Q AWRs and low-Q LCRs) proves the feasibility of this hybrid concept, as it exhibits approx. 1 dB less Insertion Loss (IL). The lighter solid lines (1310 and 1312) show the hybrid resonators disclosed herein.

According to a second aspect of the disclosure, two complementary circuit configurations are disclosed, which enable wide-band filtering with sharp roll-off on either side of the passband. Advanced filter functionality may be achieved by cascading multiple stages, which may result in a ladder-type design. One stage may consist of an acoustic-wave resonator in either series or shunt configuration and LC resonators in the other branches.

Of note, the overall filter bandwidth may be independent of the employed piezoelectric material. This is of great significance in hybrid filter design, as it permits adjustment of filter bandwidth of a piezoelectric material while maintaining high quality output. Otherwise stated, this permits the filter bandwidth of a known or existing piezoelectric material to be tailored to a specific implementation or need, rather than, for example, searching for a new piezoelectric material with a nature resonance corresponding to the desired bandwidth. Overall stopband rejection of the filter may depend on a number of used stages in cascade. That is, filter may be highly configurable such that it may include more or fewer stages.

Advantageously for use as a filter, the high Q of the acoustic-wave resonators results in a sharp roll-off and a notch in the filter response on one side of the passband. This permits the filter to be used in a variety of applications in which sharp demarcation is necessary, such as, for example, in separating closely adjacent bands in wireless communications.

AWRs alone provide excellent filtering quality, but are generally material-dependent and thus not well-suited for application for bandwidths that do not correspond to their natural frequencies. Various attempts have been made to form hybrid filters that maintain the advantages of AWRs (e.g., quality of output, ease of integration, etc.) with other signal technologies, such as technologies that utilize bandwidths outside the natural bandwidth that corresponds to the material of the AWR. One approach has been to combine microstrip coupled lines and AWRs. However, the coupled lines require considerable area for frequencies below 6 GHz (3 cm×3 cm), and therefore their integration into products may be impractical or otherwise limited. Further rending this strategy undesirable, such approaches may require a high number of resonators for the achieved stopband suppression.

Such AWLRs in combination with discrete inductors and capacitors (i.e., inductors and/or capacitors that are not configured in the arrangements as described herein) have exhibited less than ideal performance. For example, such configurations have been known to suffer from low stopband suppression and/or greater insertion loss due to a high number of lossy elements. Both approaches include a high number of inductors, which usually require much area. Furthermore, inductive coupling between inductors may limit filter performance significantly. The bandwidth of the symmetric AWLR (note that AWLR, in this particular example, is intended to refereeing exclusively to an AWR with a parallel inductor) concept is generally limited by:

$$FBW < \sqrt{k_{eff}^2} \quad (17)$$

Two novel filter structures that are complementary to each other and enable wide-band filter design with asymmetric filter responses are presented. The presented structures are referred to as single stages and may be combined in cascades of the same type to provide advanced filter functionality.

Figure 15:
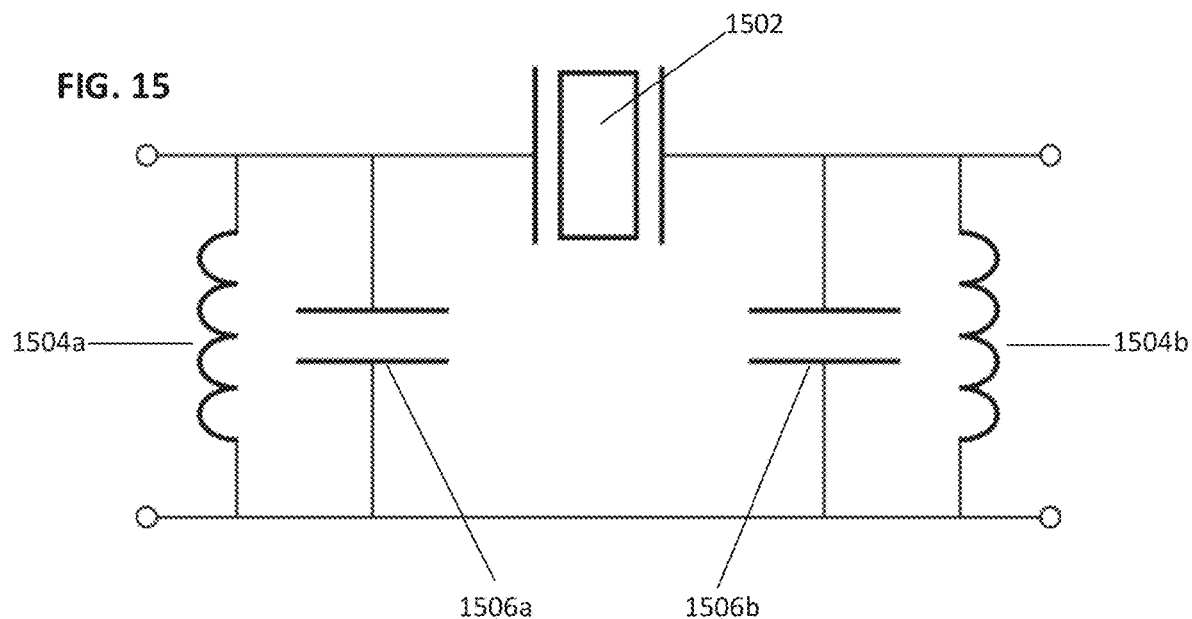
FIG. 15 depicts a first filter structure according to the second aspect of the disclosure.

FIG. 15 depicts a first filter structure according to the second aspect of the disclosure. This filter stage has an AWR 1502 in the series branch, with two shunt branches having equal parallel LC resonators (LC Resonators), forming a pi-type structure. Each parallel LC resonator includes an inductor 1504a, 1504b, and a capacitor 1506a, 1506b.

Figure 16:
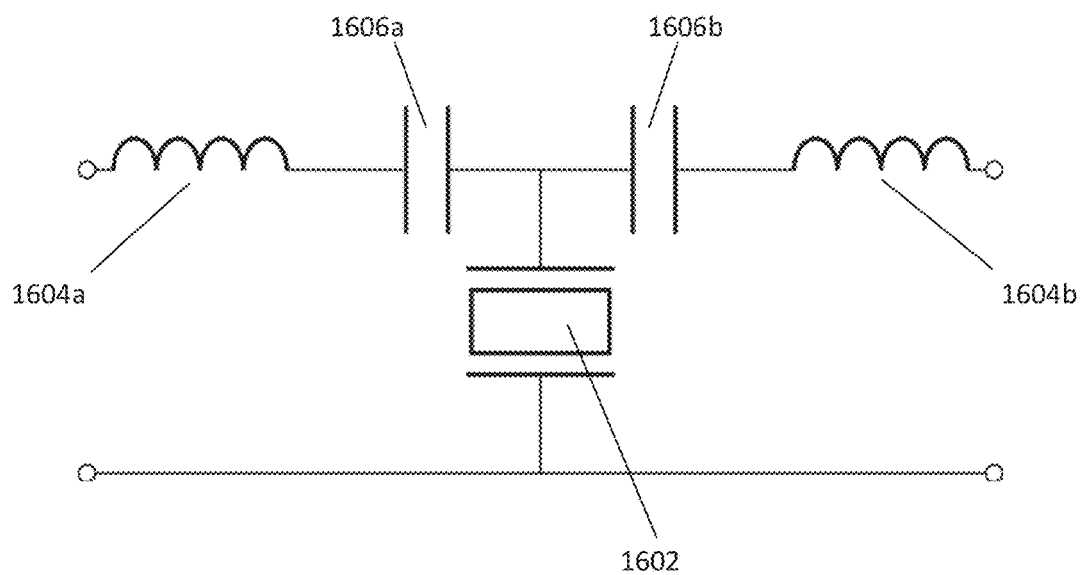
FIG. 16 depicts a second filter structure according to the second aspect of the disclosure.

FIG. 16 depicts a second filter structure according to the second aspect of the disclosure. This second stage has an AWR 1602 in the shunt branch and series LC resonators in each of its series branches, forming a T-type structure. Each LC resonator (LC Resonator) includes an inductor 1604a, 1604b, and a capacitor 1606a, 1606b.

A notable characteristic in the stages depicted in FIG. 15 and FIG. 16 is that a single AWR is used only in either series or shunt branch. The filter response of the pi-section with series AWR exhibits a notch in the upper stopband. It may therefore be used for filters with sharp roll-off near the upper passband edge. Similarly, the T-section shows a notch in the lower stopband and thus may be used for filters with sharp roll-off near the lower passband edge.

The typical design of a single stage depends on the realizable capacitance ratio r and the notch placement. These two parameters can be defined at the outset, e.g. by choosing appropriate resonator material and thickness (for BAW resonators). The overall bandwidth of the filter does not depend on r and the notch frequency; however, $C_0$ does. That means that the required resonator area is determined as a result of the filter design procedure. The values of the required lumped inductor and capacitor also depend on targeted filter bandwidth.

The filter functionality is based on cascading multiple equally designed stages. By these means, the adjacent LC resonators can be combined into single resonators.

Figure 17:
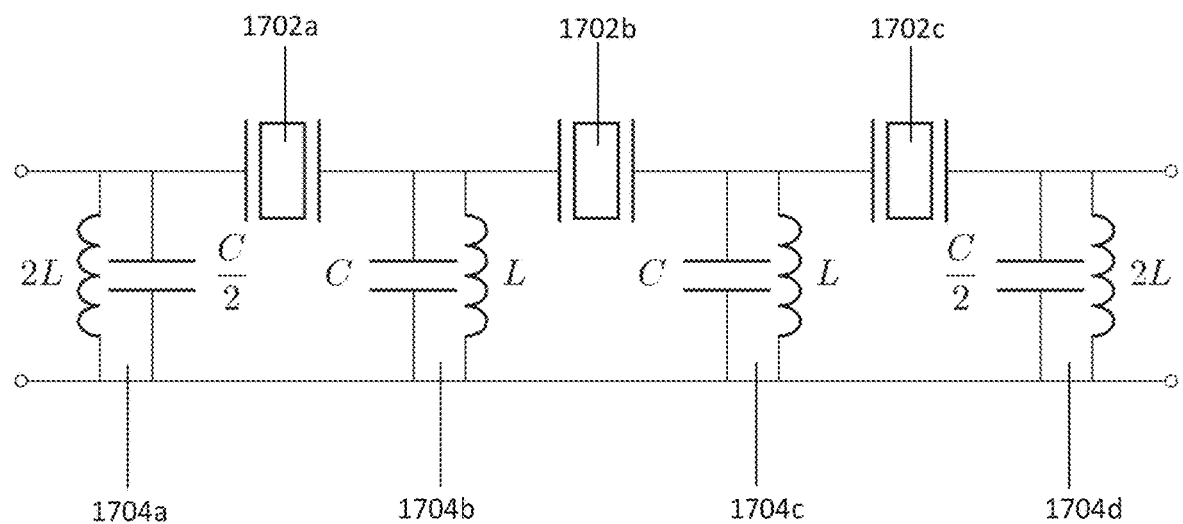
FIG. 17 depicts three cascaded filter stages, with the AWRs in series.

FIG. 17 shows three cascaded filter stages with the AWRs in series. In this example, three AWRs 1702a, 1702b, and 1702c are electrically conductively connected in series. Branching from these series connections are four LC resonators (LC Resonators) 1704a, 1704b, 1704c, and 1704d, which each include a capacitor and an inductor.

Figure 18:
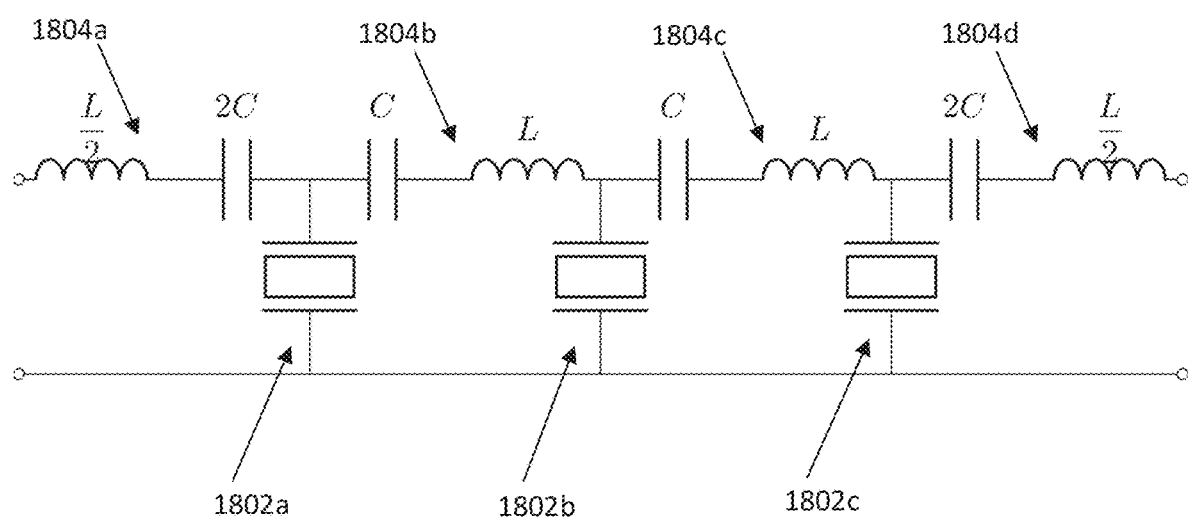
FIG. 18 depicts three cascaded filter stages, with the AWRs in parallel.

FIG. 18 shows three cascaded filter stages with the AWRs in parallel. In this example, three AWRs 1802a, 1802b, and 1802c are connected in parallel. Four LC resonators (LC Resonators) 1804a, 1804b, 1804c, and 1804d, each including a capacitor and an inductor, a placed along a conductive line from which the parallel connections branch.

By cascading stages as depicted in FIG. 17 and FIG. 18, the overall filter behavior is changed, which has significant impact on stopband suppression. As a rough approximation, the overall stopband suppression of N stages in logarithmic scale can be approximated by N times the stopband suppression of a single stage in logarithmic scale The typical process for designing a filter as disclosed herein may be as follows. First, the resonance frequencies for a suitable acoustic-wave resonator may be determined. Then, depending on the resonator properties and the desired bandwidth of the filter, the elements of a single stage may be determined by the formulas. Afterwards, depending on required stopband behavior, the number of required stages to be cascaded is chosen. Finally, the behavior of the filter can be optimized.

Figure 19:
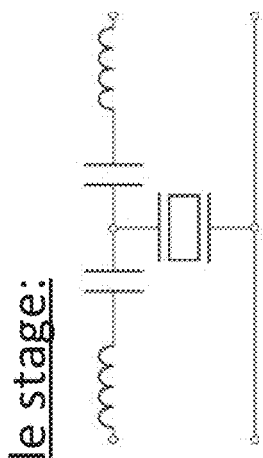
FIG. 19 depicts sample filter responses of cascades of the given stages.
Figure 19:
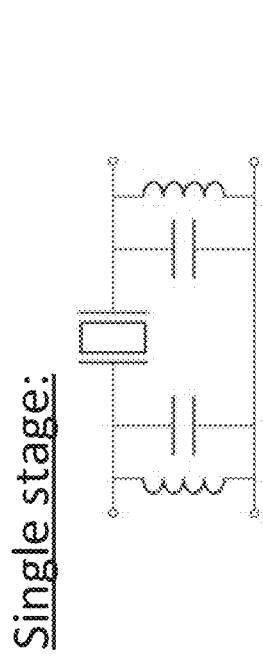
Figure 19:
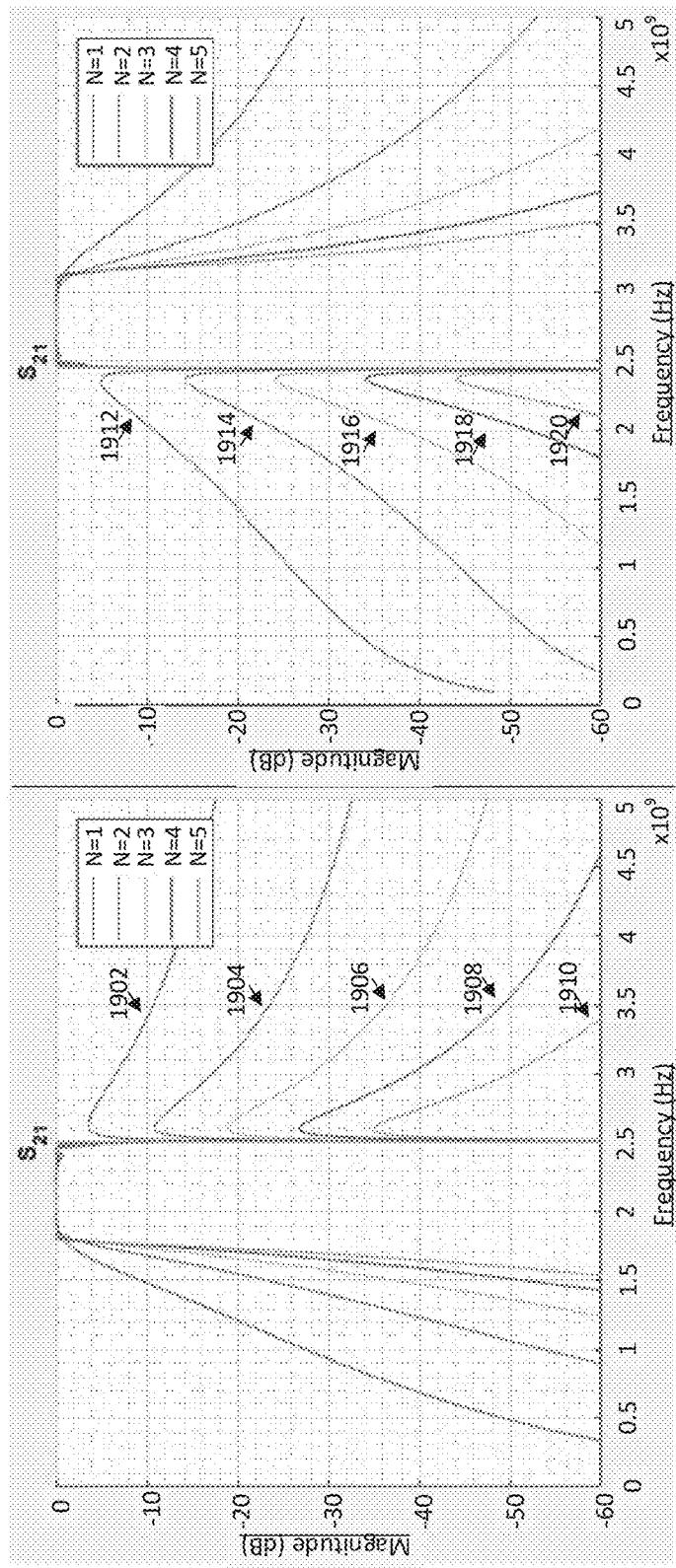
Figure 20:
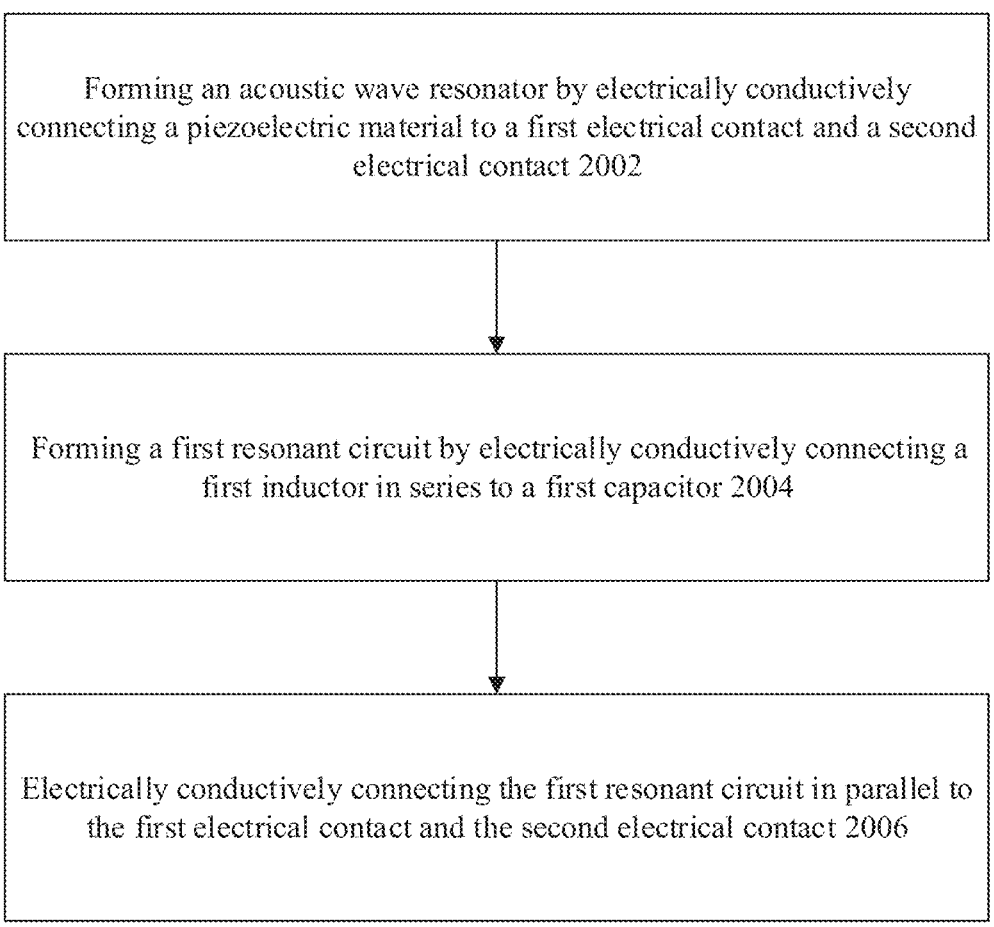
FIG. 20 depicts a method for manufacturing a hybrid resonator.

FIG. 19 shows sample filter responses of cascades of the given stages, as described above. In detail, the filter responses are shown for a number of N=1 to 5 stages. On the left side of FIG. 19, a sharp roll-off on the upper side of the frequency bandwidth is established by utilizing one or more stages including an AWR, connected in series to two LC resonators, wherein each resonator includes an inductor and a capacitor connected in parallel. The results of a single stage, two stages, three stages, four stages, and five stages are depicted as 1902, 1904, 1906, 1908, and 1910, respectively. On the right side of FIG. 19, a sharp roll-off on the lower side of the frequency bandwidth is established by utilizing one or more stages including two LC resonators connected in series, each LC resonator having an inductor and a capacitor connected in series, with an AWR, connected in shunt to the two LC resonators. The results of a single stage, two stages, three stages, four stages, and five stages are depicted as 1912, 1914, 1916, 1918, and 1920, respectively. For the depictions in FIG. 19, it should be noted that the bandwidth is set at ~600 MHz with an AWR of ~2.4 GHz series resonance frequency in both cases. The bandwidth is theoretically not limited. This example also shows that the concept proves especially useful for duplex filters. Therefore, similar resonators can be used for both types of filter stages, only differing in area.

It is expressly noted that both types of filters may be combined in a single implementation to reach a desired filtered bandwidth. That is, a first filter with a sharp roll-off on the high side and a second filter with a sharp roll-off on the low side may be combined to essentially block or filter out all but a particular range between the roll-off points.

The hybrid resonators and/or filter stages described herein may include two or more electrical contacts. These electrical contacts may be in addition to the electrodes/electrical contacts that are part of the respective AWR(s) and which may be adjacent to the AWR's piezoelectric material. Rather, the additional electrical contacts described in this paragraph may permit an electrically conductive connection to the hybrid resonator and/or filter stages described herein. For example, the hybrid resonators described in the first aspect of the disclosure may include two electrical contacts, as depicted on the leftmost and rightmost portions of the objects in FIG. 8 and FIG. 10. Said electrical contacts may permit an electrically conductive connection to the conductor that connects the AWR and the LC resonator. Further, the filter stages described according to the second aspect herein may also include these additional electrical contacts, beyond those electrical connections that are part of the AWR. This may be seen, for example, on FIG. 15 and FIG. 16, which each depict four electrical connectors on the leftmost and rightmost portions of each figure.

According to an aspect of the disclosure, the piezoelectric material may include one or more inductive and/or one or more shielding vias, which may reduce or prevent unwanted change caused by heat and/or inductive currents.

In the following, various examples are described that may refer to one or more aspects of the disclosure.

In Example 1, a hybrid resonator is disclosed, including an acoustic wave resonator; including a piezoelectric material; a first electrical contact, electrically conductively connected to the piezoelectric material; and a second electrical contact, electrically conductively connected to the piezoelectric material; and a first resonant circuit, electrically conductively connected in series or parallel to the acoustic wave resonator via at least one of the first electrical contact and the second electrical contact, the resonant circuit including a first inductor, and a first capacitor; wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series.

In Example 2, the hybrid resonator of Example 1 is disclosed, wherein the first resonant circuit is electrically conductively connected in series to the acoustic wave resonator, and wherein a parallel resonance of the first resonant circuit is approximately equal to a parallel resonance of the acoustic wave resonator.

In Example 3, the hybrid resonator of Example 1 is disclosed, wherein the first resonant circuit is electrically conductively connected in series to the acoustic wave resonator, and wherein a parallel resonance of the first resonant circuit is equal to a parallel resonance of the acoustic wave resonator.

In Example 4, the hybrid resonator of Example 1 is disclosed, wherein the first resonant circuit is electrically conductively connected in parallel to the acoustic wave resonator, and wherein a series resonance of the first resonant circuit is approximately equal to a series resonance of the acoustic wave resonator.

In Example 5, the hybrid resonator of Example 1 is disclosed, wherein the first resonant circuit is electrically conductively connected in parallel to the acoustic wave resonator, and wherein a series resonance of the first resonant circuit is equal to a series resonance of the acoustic wave resonator.

In Example 6, the hybrid resonator of Example 1 is disclosed, further including a second resonant circuit, electrically conductively connected to the acoustic wave resonator, the second resonant circuit including: a second inductor, and a second capacitor; wherein, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

In Example 7, the hybrid resonator of Example 6 is disclosed, wherein the second resonant circuit is electrically conductively connected in series to the acoustic wave resonator, and wherein a parallel resonance of the second resonant circuit is approximately equal to a parallel resonance of the acoustic wave resonator.

In Example 8, the hybrid resonator of Example 6 is disclosed, wherein the second resonant circuit is electrically conductively connected in series to the acoustic wave resonator, and wherein a parallel resonance of the second resonant circuit is equal to a parallel resonance of the acoustic wave resonator.

In Example 9, the hybrid resonator of Example 6 is disclosed, wherein the second resonant circuit is electrically conductively connected in parallel to the acoustic wave resonator, and wherein a series resonance of the second resonant circuit is approximately equal to a series resonance of the acoustic wave resonator.

In Example 10, the hybrid resonator of Example 6 is disclosed, wherein the second resonant circuit is electrically conductively connected in parallel to the acoustic wave resonator, and wherein a series resonance of the second resonant circuit is equal to a series resonance of the acoustic wave resonator.

In Example 11, the hybrid resonator of any one of Examples 1 to 10 is disclosed, wherein an electromechanical coupling coefficient of the hybrid resonator is greater than an electromechanical coupling coefficient of the piezoelectric material.

In Example 12, the hybrid resonator of any one of Examples 1 to 11 is disclosed, wherein at least one of the first resonant circuit or the second resonant circuit has a quality factor (Q factor) of 50.

In Example 13, the hybrid resonator of any one of Examples 1 to 12 is disclosed, wherein the hybrid resonator has an electromechanical coupling coefficient of between 20% and 34%.

In Example 14, a filter including a plurality of hybrid resonators is disclosed, electrically conductively connected to one another, each hybrid resonator including: an acoustic wave resonator; including a piezoelectric material; a first electrical contact, electrically conductively connected to the piezoelectric material; and a second electrical contact, electrically conductively connected to the piezoelectric material; and a first resonant circuit, electrically conductively connected in series or parallel to the acoustic wave resonator via at least one of the first electrical contact and the second electrical contact, the resonant circuit including a first inductor, and a first capacitor; wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series.

In Example 15, the filter of Example 14 is disclosed, wherein for each hybrid resonator the first resonant circuit is electrically conductively connected in series to the acoustic wave resonator, and wherein a parallel resonance of the first resonant circuit is approximately equal to a parallel resonance of the acoustic wave resonator.

In Example 16, the filter of Example 14 is disclosed, wherein for each hybrid resonator the first resonant circuit is electrically conductively connected in series to the acoustic wave resonator, and wherein a parallel resonance of the first resonant circuit is equal to a parallel resonance of the acoustic wave resonator.

In Example 17, the filter of Example 14 is disclosed, wherein for each hybrid resonator the first resonant circuit is electrically conductively connected in parallel to the acoustic wave resonator, and wherein a series resonance of the first resonant circuit is approximately equal to a series resonance of the acoustic wave resonator.

In Example 18, the filter of Example 14 is disclosed, wherein for each hybrid resonator the first resonant circuit is electrically conductively connected in parallel to the acoustic wave resonator, and wherein a series resonance of the first resonant circuit is equal to a series resonance of the acoustic wave resonator.

In Example 19, the filter of Example 14 is disclosed, further including for each hybrid resonator a second resonant circuit, electrically conductively connected to the acoustic wave resonator for a corresponding hybrid resonator, the second resonant circuit including: a second inductor, and a second capacitor; wherein, for each hybrid resonator, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

In Example 20, the filter of Example 19 is disclosed, wherein for each hybrid resonator the second resonant circuit is electrically conductively connected in series to the acoustic wave resonator, and wherein a parallel resonance of the second resonant circuit is approximately equal to a parallel resonance of the acoustic wave resonator.

In Example 21, the filter of Example 19 is disclosed, wherein for each hybrid resonator the second resonant circuit is electrically conductively connected in series to the acoustic wave resonator, and wherein a parallel resonance of the second resonant circuit is equal to a parallel resonance of the acoustic wave resonator.

In Example 22, the filter of Example 19 is disclosed, wherein for each hybrid resonator the second resonant circuit is electrically conductively connected in parallel to the acoustic wave resonator, and wherein a series resonance of the second resonant circuit is approximately equal to a series resonance of the acoustic wave resonator.

In Example 23, the filter of Example 19 is disclosed, wherein the second resonant circuit is electrically conductively connected in parallel to the acoustic wave resonator, and wherein a series resonance of the second resonant circuit is equal to a series resonance of the acoustic wave resonator.

In Example 24, the filter of any one of Examples 14 to 23 is disclosed, wherein an electromechanical coupling coefficient of each hybrid resonator is greater than an electromechanical coupling coefficient of the piezoelectric material.

In Example 25, the filter of any one of Examples 14 to 24 is disclosed, wherein for each hybrid resonator at least one of the first resonant circuit or the first resonant circuit has a quality factor (Q factor) of 50.

In Example 26, the filter of any one of Examples 14 to 25 is disclosed, wherein each hybrid resonator has an electromechanical coupling coefficient of between 20% and 34%.

In Example 27, the method of manufacturing a hybrid resonator is disclosed, including: forming an acoustic wave resonator by electrically conductively connecting a piezoelectric material to a first electrical contact and a second electrical contact; forming a first resonant circuit by electrically conductively connecting a first inductor in series to a first capacitor; and electrically conductively connecting the first resonant circuit in parallel to the first electrical contact and the second electrical contact.

In Example 28, the method of manufacturing a hybrid resonator of Example 27 is disclosed, further including: forming a second resonant circuit by electrically conductively connecting a second inductor in series to a second capacitor; and electrically conductively connecting the second resonant circuit in parallel to the first electrical contact and the second electrical contact.

In Example 29, the method of manufacturing a hybrid resonator is disclosed, including: forming an acoustic wave resonator by electrically conductively connecting a piezoelectric material to a first electrical contact and a second electrical contact; forming a first resonant circuit by electrically conductively connecting a first inductor in parallel to a first capacitor; and electrically conductively connecting the first resonant circuit in series to the first electrical contact and the second electrical contact.

In Example 30, the method of manufacturing a hybrid resonator of Example 29 is disclosed, further including: forming a second resonant circuit by electrically conductively connecting a second inductor in parallel to a second capacitor; and electrically conductively connecting the second resonant circuit in series to the first electrical contact and the second electrical contact.

In Example 31, a filtering means is disclosed, including: an acoustic wave resonating means, for utilizing a piezoelectric material to convert acoustic waves into electrical energy or electrical energy into acoustic waves; a first resonating means, electrically conductively connected in series or parallel to the acoustic wave resonating means, the first resonating means for transferring electrical energy between its component parts at a predetermined frequency; wherein, if the first resonating means is electrically conductively connected to the acoustic wave resonating means in series, the component parts of the first resonating means are electrically conductively connected to one another in parallel, and if the first resonating means is electrically conductively connected to the acoustic wave resonating means in parallel, the component parts of the first resonating means are electrically conductively connected to one another in series.

In Example 32, the filtering means of Example 30 is disclosed, further including a second resonating means, electrically conductively connected to the acoustic wave resonating means, the second resonating means for transferring electrical energy between its component parts at a predetermined frequency; wherein, if the first resonating means is electrically conductively connected to the acoustic wave resonating means in series, the component parts of the second resonating means are electrically conductively connected to one another in parallel, and if the first resonating means is electrically conductively connected to the acoustic wave resonating means in parallel, the component parts of the second resonating means are electrically conductively connected to one another in series.

In Example 33, the filtering means of Example 30 or 31 is disclosed, wherein the filtering means passes an electrical signal in a range different from a range that the acoustic wave resonating means passes an electrical signal without the first resonating means.

In Example 34, a filter stage is disclosed, including a plurality of hybrid resonators, electrically conductively connected to one another, each hybrid resonator including an acoustic wave resonator; including a piezoelectric material; a first electrical contact, electrically conductively connected to the piezoelectric material; and a second electrical contact, electrically conductively connected to the piezoelectric material; and a first resonant circuit, electrically conductively connected in series or parallel to the acoustic wave resonator via at least one of the first electrical contact and the second electrical contact, the resonant circuit including a first inductor, and a first capacitor; wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series; and a second resonant circuit, electrically conductively connected to the acoustic wave resonator, the second resonant circuit including: a second inductor, and a second capacitor; wherein, for each hybrid resonator, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

In Example 35, the filter stage of Example 34 is disclosed, wherein the plurality of hybrid resonators are electrically conductively connected to one another in a cascade fashion.

In Example 36, the filter stage of Example 34 or 35 is disclosed, wherein the filter stage receives a signal input and outputs a output signal characterized by a sharp roll-off at a higher frequency than the center frequency of the output signal's passband.

In Example 37, the filter stage of any one of Examples 34 or 36 is disclosed, wherein the filter stage receives a signal input and outputs a output signal characterized by a sharp roll-off at a lower frequency than the center frequency of the output signal's passband.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A hybrid resonator comprising:
   an acoustic wave resonator comprising:
      a piezoelectric material;
      a first electrical contact electrically conductively connected to the piezoelectric material; and
      a second electrical contact electrically conductively connected to the piezoelectric material; and
   a first resonant circuit electrically conductively connected in series or parallel to the acoustic wave resonator via at least one of the first electrical contact and the second electrical contact, the first resonant circuit comprising:
      a first inductor; and
      a first capacitor,
   wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series.

2. The hybrid resonator of claim 1, wherein the first resonant circuit is electrically conductively connected in series to the acoustic wave resonator, and wherein a parallel resonance of the first resonant circuit is approximately equal to a parallel resonance of the acoustic wave resonator.

3. The hybrid resonator of claim 1, wherein the first resonant circuit is electrically conductively connected in parallel to the acoustic wave resonator, and wherein a series resonance of the first resonant circuit is approximately equal to a series resonance of the acoustic wave resonator.

4. The hybrid resonator of claim 1, further comprising a second resonant circuit electrically conductively connected to the acoustic wave resonator, the second resonant circuit comprising:
   a second inductor; and
   a second capacitor,
   wherein, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

5. The hybrid resonator of claim 4, wherein the second resonant circuit is electrically conductively connected in series to the acoustic wave resonator, and wherein a parallel resonance of the second resonant circuit is approximately equal to a parallel resonance of the acoustic wave resonator.

6. The hybrid resonator of claim 4, wherein the second resonant circuit is electrically conductively connected in parallel to the acoustic wave resonator, and wherein a series resonance of the second resonant circuit is approximately equal to a series resonance of the acoustic wave resonator.

7. The hybrid resonator of claim 4, wherein an electromechanical coupling coefficient of the hybrid resonator is greater than an electromechanical coupling coefficient of the piezoelectric material.

8. The hybrid resonator of claim 5, wherein at least one of the first resonant circuit or the second resonant circuit has a quality factor (Q factor) of 50.

9. The hybrid resonator of claim 5, wherein the hybrid resonator has an electromechanical coupling coefficient of between 20% and 34%.

10. A filter comprising a plurality of hybrid resonators electrically conductively connected to one another, each hybrid resonator comprising:
    an acoustic wave resonator comprising:
       a piezoelectric material;
       a first electrical contact electrically conductively connected to the piezoelectric material; and
       a second electrical contact electrically conductively connected to the piezoelectric material; and
    a first resonant circuit electrically conductively connected in series or parallel to the acoustic wave resonator via at least one of the first electrical contact and the second electrical contact, the resonant circuit comprising:
       a first inductor; and
       a first capacitor,
    wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series.

11. The filter of claim 10, wherein for each hybrid resonator the first resonant circuit is electrically conductively connected in series to the acoustic wave resonator, and wherein a parallel resonance of the first resonant circuit is approximately equal to a parallel resonance of the acoustic wave resonator.

12. The filter of claim 10, wherein for each hybrid resonator the first resonant circuit is electrically conductively connected in parallel to the acoustic wave resonator, and wherein a series resonance of the first resonant circuit is approximately equal to a series resonance of the acoustic wave resonator.

13. The filter of claim 10, further comprising for each hybrid resonator a second resonant circuit electrically conductively connected to the acoustic wave resonator for a corresponding hybrid resonator, the second resonant circuit comprising:
    a second inductor; and
    a second capacitor,
    wherein, for each hybrid resonator, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

14. The filter of claim 13, wherein for each hybrid resonator the second resonant circuit is electrically conductively connected in series to the acoustic wave resonator, and wherein a parallel resonance of the second resonant circuit is approximately equal to a parallel resonance of the acoustic wave resonator.

15. The filter of claim 13, wherein for each hybrid resonator the second resonant circuit is electrically conductively connected in parallel to the acoustic wave resonator, and wherein a series resonance of the second resonant circuit is approximately equal to a series resonance of the acoustic wave resonator.

16. The filter of claim 13, wherein an electromechanical coupling coefficient of each hybrid resonator is greater than an electromechanical coupling coefficient of the piezoelectric material.

17. A filter stage comprising a plurality of hybrid resonators electrically conductively connected to one another, each hybrid resonator comprising:
    an acoustic wave resonator, comprising:
        a piezoelectric material;
        a first electrical contact electrically conductively connected to the piezoelectric material; and
        a second electrical contact electrically conductively connected to the piezoelectric material;
    a first resonant circuit electrically conductively connected in series or parallel to the acoustic wave resonator via at least one of the first electrical contact and the second electrical contact, the first resonant circuit comprising a first inductor and a first capacitor, wherein, if the first resonant circuit is electrically conductively connected to the acoustic wave resonator in series, the first inductor and the first capacitor are electrically conductively connected to one another in parallel, and if the first resonant circuit is electrically conductively connected to the acoustic wave resonator in parallel, the first inductor and the first capacitor are electrically conductively connected to one another in series; and
    a second resonant circuit electrically conductively connected to the acoustic wave resonator, the second resonant circuit comprising:
        a second inductor; and
        a second capacitor,
    wherein, for each hybrid resonator, if the first resonant circuit is electrically conductively connected to the acoustic wave resonator in series, the second inductor and the second capacitor are electrically conductively connected to one another in parallel, and if the first resonant circuit is electrically conductively connected to the acoustic wave resonator in parallel, the second inductor and the second capacitor are electrically conductively connected to one another in series.

18. The filter stage of claim 17, wherein the plurality of hybrid resonators are electrically conductively connected to one another in a cascade fashion.

19. The filter stage of claim 17, wherein the filter stage receives a signal input and outputs an output signal characterized by a sharp roll-off at a higher frequency than the center frequency of the output signal's passband.

20. The filter stage of claim 17, wherein the filter stage receives a signal input and outputs an output signal characterized by a sharp roll-off at a lower frequency than the center frequency of the output signal's passband.

* * * * *